United States Patent
Kibune et al.

(10) Patent No.: US 8,634,454 B2
(45) Date of Patent: Jan. 21, 2014

(54) RECEIVER CIRCUIT, METHOD OF ADJUSTING OFFSET, AND TRANSMISSION/RECEPTION SYSTEM

(75) Inventors: Masaya Kibune, Kawasaki (JP); Hirotaka Tamura, Kawasaki (JP)

(73) Assignee: Fujitsu Limted, Kawasaki (JP)

( * ) Notice: Subject to any disclaimer, the term of this patent is extended or adjusted under 35 U.S.C. 154(b) by 364 days.

(21) Appl. No.: 12/826,420

(22) Filed: Jun. 29, 2010

(65) Prior Publication Data

US 2011/0002374 A1  Jan. 6, 2011

(30) Foreign Application Priority Data

Jul. 2, 2009  (JP) .................................. 2009-157532

(51) Int. Cl.
*H03K 5/159* (2006.01)
*H04B 1/10* (2006.01)

(52) U.S. Cl.
USPC .......................................... 375/232; 375/350

(58) Field of Classification Search
USPC .......................................... 375/232–236, 350
See application file for complete search history.

(56) References Cited

U.S. PATENT DOCUMENTS

| | | | |
|---|---|---|---|
| 4,500,999 A * | 2/1985 | Takatori et al. ............... | 375/236 |
| 4,786,849 A | 11/1988 | Tateishi | |
| 5,499,268 A | 3/1996 | Takahashi | |
| 6,038,266 A | 3/2000 | Lee et al. | |
| 7,215,632 B2 | 5/2007 | Horibe | |
| 2004/0076245 A1 * | 4/2004 | Okamoto et al. ............. | 375/341 |
| 2004/0172148 A1 | 9/2004 | Horibe | |
| 2006/0092804 A1 * | 5/2006 | Otake et al. ................ | 369/59.22 |
| 2007/0230640 A1 * | 10/2007 | Bryan et al. .................. | 375/349 |
| 2008/0013617 A1 * | 1/2008 | Ooi ............................... | 375/232 |
| 2008/0049600 A1 * | 2/2008 | Liu ............................... | 370/208 |
| 2010/0014573 A1 * | 1/2010 | Momtaz et al. ............... | 375/231 |

FOREIGN PATENT DOCUMENTS

| | | |
|---|---|---|
| JP | 63-78386 A | 4/1988 |
| JP | 1-110265 A | 4/1989 |
| JP | 6-177801 A | 6/1994 |
| JP | 10-163934 A | 6/1998 |
| JP | 2000-278185 A | 10/2000 |
| JP | 4081018 B2 | 4/2008 |
| WO | WO-03/077248 A1 | 9/2003 |

OTHER PUBLICATIONS

James E.C. Brown, et al., "A 35 Mb/s mixed-signal decision-feedback equalizer for disk drives in 2-μm CMOS", IEEE Journal of Solid-State Circuits, U.S.A., IEEE, Sep. 1996, vol. 31, No. 9, pp. 1258-1266.

* cited by examiner

*Primary Examiner* — Don N Vo
(74) *Attorney, Agent, or Firm* — Arent Fox LLP

(57) ABSTRACT

A receiver circuit includes: an equalization circuit that equalizes a first signal to obtain a second signal, and adjusts a characteristic of an equalization in accordance with an error between the second signal and a third signal; and a first offset adjustment circuit that adjusts an offset of the first signal in accordance with an error signal indicating the error.

16 Claims, 17 Drawing Sheets

RECEIVER CIRCUIT, METHOD OF ADJUSTING OFFSET, AND TRANSMISSION/RECEPTION SYSTEM

CROSS-REFERENCE TO RELATED APPLICATIONS

This application claims the benefit of priority from Japanese Patent Application No. 2009-157532 filed on Jul. 2, 2009, the entire contents of which are incorporated herein by reference.

BACKGROUND

1. Field

The embodiments discussed herein relate to a receiver circuit.

2. Description of Related Art

In signal transmission between circuit blocks, various elements, such as chips, enclosures, a plurality of buffers, and amplifier circuits may be arranged on a signal transmission path. Offsets generated due to variations in voltages and currents caused by variations in elements in the buffers may be detected or adjusted by an offset compensation circuit.

Related art technologies are disclosed in Japanese Patent No. 4081018, Japanese Laid-open Patent Publication No. S63-078386, and Japanese Laid-open Patent Publication No. H01-110265, for example.

SUMMARY

According to one aspect of the embodiments, a receiver circuit is provided which includes: an equalization circuit that equalizes a first signal to obtain a second signal, and adjusts a characteristic of an equalization in accordance with an error between the second signal and a third signal; and a first offset adjustment circuit that adjusts an offset of the first signal in accordance with an error signal indicating the error.

Additional advantages and novel features of the invention will be set forth in part in the description that follows, and in part will become more apparent to those skilled in the art upon examination of the following or upon learning by practice of the invention.

DESCRIPTION OF EMBODIMENTS

In an offset compensation circuit, a waveform evaluation circuit may evaluate a waveform of a signal prior to an equalization process, and an offset adjustment circuit adjusts an offset based on the evaluation results. The signal may be a digital signal output from an analog-to-digital converter (ADC), an analog signal before being input to the ADC, or the like. An offset compensation circuit in a digital region may detect the peak and bottom values of an output signal of the ADC, and detect an offset based on the peak and bottom values, thereby canceling the offset through feedback control of the input signal of the ADC.

Figure 1:
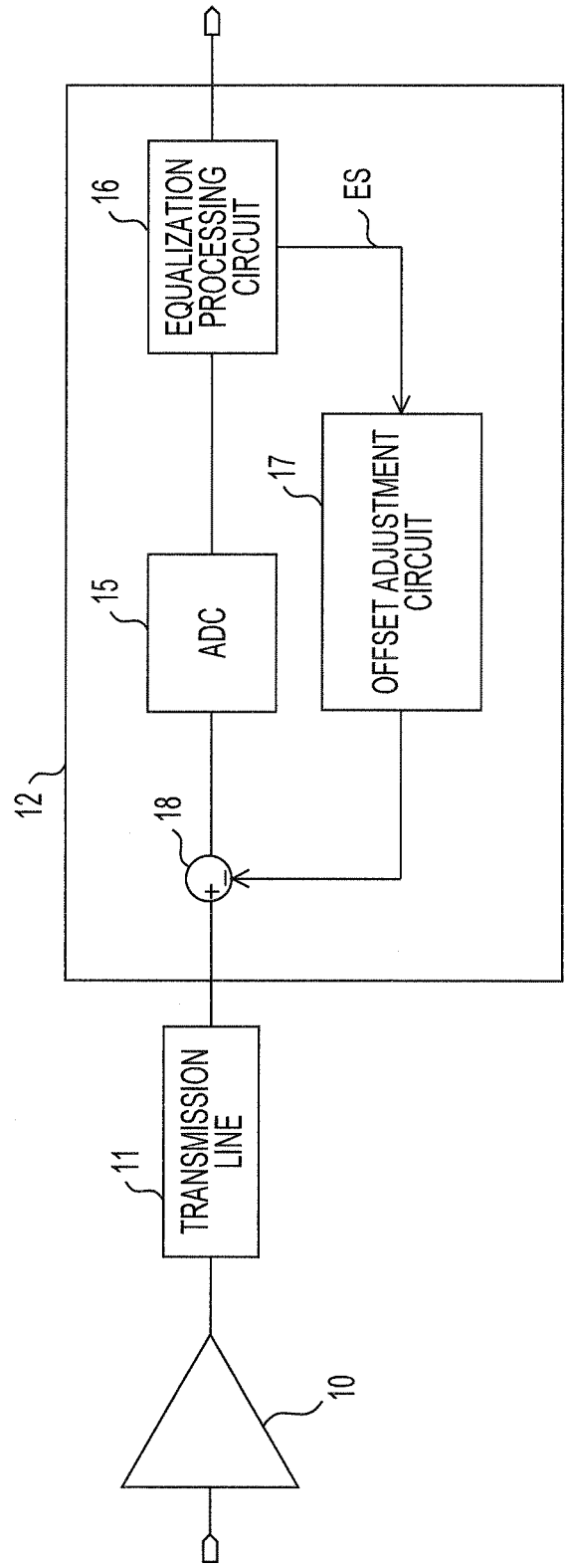
FIG. 1 illustrates an exemplary transmission/reception system.

FIG. 1 illustrates an exemplary transmission/reception system. The transmission system includes a transmission circuit 10 for transmitting a signal and a receiver circuit 12 for receiving a signal from a transmission line 11. The receiver circuit 12 includes an analog-to-digital converter (ADC) 15, an equalization processing circuit 16, an offset adjustment circuit 17, and a signal addition/subtraction circuit 18. The ADC 15 converts a reception signal, which is an analog signal, into a digital signal. The equalization processing circuit 16 performs equalization process on a first signal output from the ADC 15 and outputs the processed signal as a second signal. The equalization process circuit 16 may adjust the equalization process characteristics in accordance with an error between the second signal and a third signal having an ideal signal waveform. The third signal may be the second signal after a level detection. The offset adjustment circuit 17 receives a signal ES indicating an error from the equalization processing circuit 16 and adjusts the offset of the first signal in accordance with the signal ES. The signal addition/subtraction circuit 18 adds an analog signal output from the offset adjustment circuit 17 to a reception signal input to the ADC 15. An offset is adjusted on the input and output sides of the ADC 15. Alternatively, the offset may be adjusted such that a signal addition/subtraction circuit provided on the output side of the ADC 15 adds a digital signal output from the offset adjustment circuit 17 to the output signal of the ADC 15.

An offset is adjusted such that the error signal ES becomes smaller based on the error signal ES indicating the result of the equalization processing circuit 16.

Figure 2:
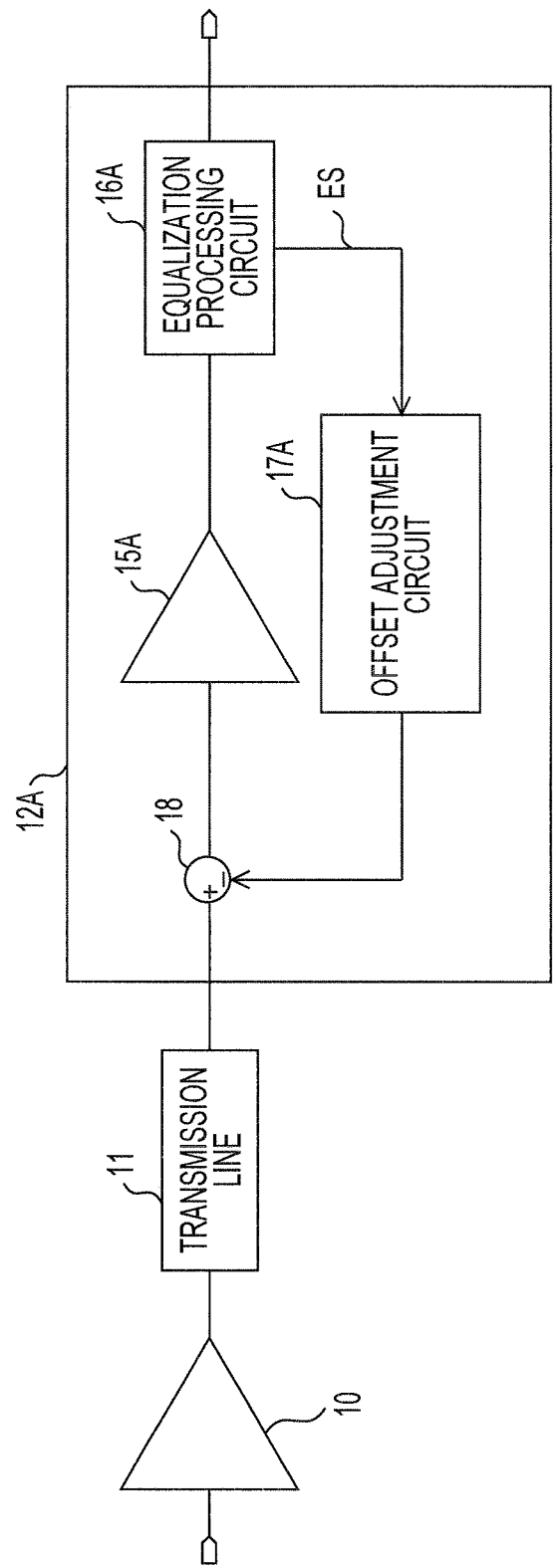
FIG. 2 illustrates an exemplary transmission/reception system.

FIG. 2 illustrates an exemplary transmission/reception system. The transmission system includes a transmission circuit 10 for transmitting a signal and a receiver circuit 12A for receiving a signal from a transmission line 11. The receiver circuit 12A includes an input circuit 15A, an equalization processing circuit 16A, an offset adjustment circuit 17A, and a signal addition/subtraction circuit 18. The input circuit 15A may include a buffer or a signal determination circuit such as a circuit for determining "0" or "1". The input circuit 15A receives an analog reception signal and outputs an analog signal. The equalization process circuit 16A operates in an analog domain. An ADC may be provided in a stage subsequent to the equalization processing circuit 16A. The equalization process circuit 16A performs equalization process on a first signal output from the input circuit 15A and outputs the processed signal as a second signal. The equalization process circuit 16A may adjust the equalization process characteristics in accordance with an error between the waveform of the second signal and the waveform of a third signal having an ideal signal waveform. The third signal may be the second signal after a level determination. The offset adjustment circuit 17A receives a signal ES indicating an error from the equalization processing circuit 16A and adjusts the offset of the first signal in accordance with the error signal ES. The operations of the equalization processing circuit 16A and the offset adjustment circuit 17A illustrated in FIG. 2 may be substantially identical or similar to those of the equalization process circuit 16 and the offset adjustment circuit 17 illustrated in FIG. 1.

Figure 3:
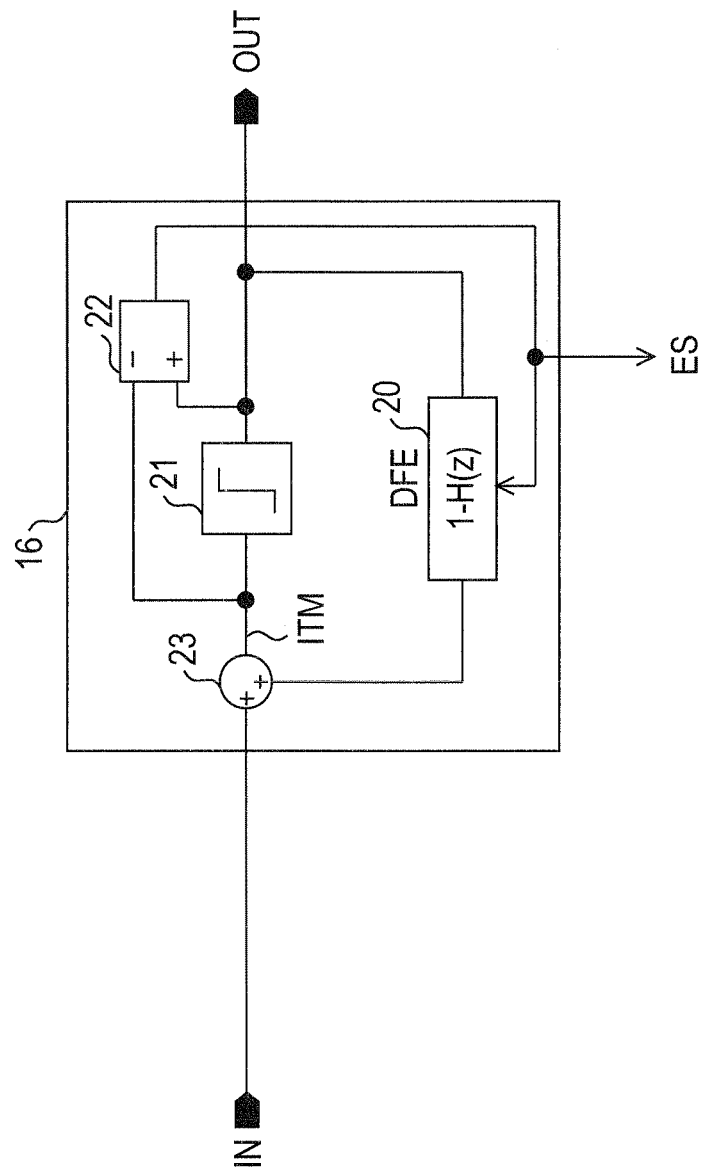
FIG. 3 illustrates an exemplary equalization processing circuit.

FIG. 3 illustrates an exemplary equalization processing circuit. The equalization process circuit 16 illustrated in FIG. 3 may be the equalization process circuit illustrated in FIG. 1. The equalization process circuit 16 includes a filter circuit 20, a determination circuit 21, an error detection circuit 22, and a signal addition/subtraction circuit 23. The filter circuit 20 adds a signal to a first signal IN from the signal addition/subtraction circuit 23, performs equalization process on the first signal IN, and outputs the processed signal as a second signal IMT. The determination circuit 21 determines a level of the second signal IMT, "0" or "1", for example, and outputs a third signal OUT, which is a signal subsequent to level determination. The error detection circuit 22 obtains an error, such as a difference, between the second signal IMT and the third signal OUT. The error may be the difference between the second signal IMT and the third signal OUT at the current timing. The coefficients of the filter circuit 20 may be adjusted in accordance with the error from the error detection circuit 22. At, for example, the initialization time of the receiver circuit 12, the filter coefficients may be adjusted so as to make the error smaller. The error from the error detection circuit 22 may be output as the error signal ES from the equalization process circuit 16.

Figure 4:
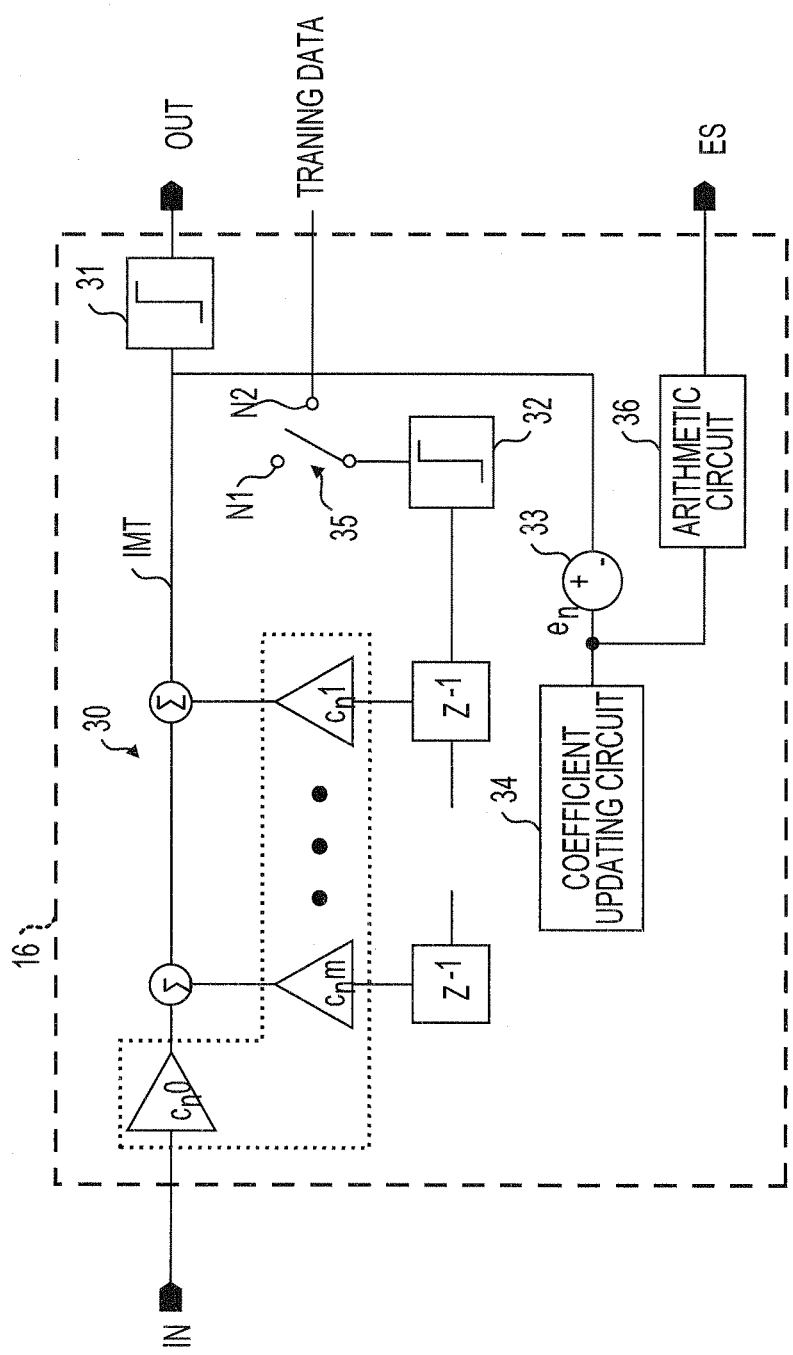
FIG. 4 illustrates an exemplary equalization processing circuit.

FIG. 4 illustrates an exemplary equalization process circuit. The equalization process circuit 16 illustrated in FIG. 4 may be the equalization process circuit illustrated in FIG. 1. The equalization process circuit 16 includes a decision feedback equalizer (DEE). The equalization process circuit 16 includes a filter circuit 30, a determination circuit 31, a determination circuit 32, an error detection circuit 33, a coefficient updating circuit 34, a switch 35, and an arithmetic circuit 36. The filter circuit 30 includes a plurality of delay elements $Z^{-1}$, a multiplication circuit that multiplies a signal by coefficients $c_n0$ to $c_nm$, which are coefficients at time n, and an addition circuit $\Sigma$. The filter circuit 30 performs equalization process on a first signal IN and outputs the processed signal as a second signal IMT. The determination circuit 31 outputs a third signal OUT after a level determination of "0" or "1", for example. The determination circuit 32, when the switch 35 is coupled to a node N1 side, determines the level of the second signal IMT, and outputs a signal which is substantially the same as the third signal OUT. When the switch 35 is coupled to a node N2 side, the determination circuit 32 outputs training data. The error detection circuit 33 obtains an error, such as a difference, between the second signal IMT and either the signal substantially equal to the third signal OUT or the training data. The error may be the difference between the two signals at the current timing. The filter coefficients $c_n0$ to $c_nm$ of the filter circuit 30 may be updated in accordance with the error output by the error detection circuit 33. The coefficients may be updated using a least mean squares (LMS) algorithm or a recursive least squares (RLS) algorithm, whereby the filter coefficients may be adjusted so as to minimize the mean square error of the error. The adjustment of the filter coefficients may be performed at the time of startup, for example, of the receiver circuit 12. A signal substantially equal to the third signal OUT or training data may be used for the adjustment of the filter coefficients at the time of startup, for example.

When the coefficients of the filter circuit 30 of the equalization processing circuit 1 is initialized, the filter coefficients may be adjusted based on the training data by coupling the switch 35 to the node N2 side. The first signal IN input to the equalization process circuit 16 may be a signal received by the receiver subsequent to the training data signal transmitted from a transmitter.

The arithmetic circuit 36 may perform a given operation on the error output from the error detection circuit 33, and output the error signal ES from the equalization processing circuit 16. The operation process includes, for example, computing the square and calculating the absolute value of the error.

Figure 5:
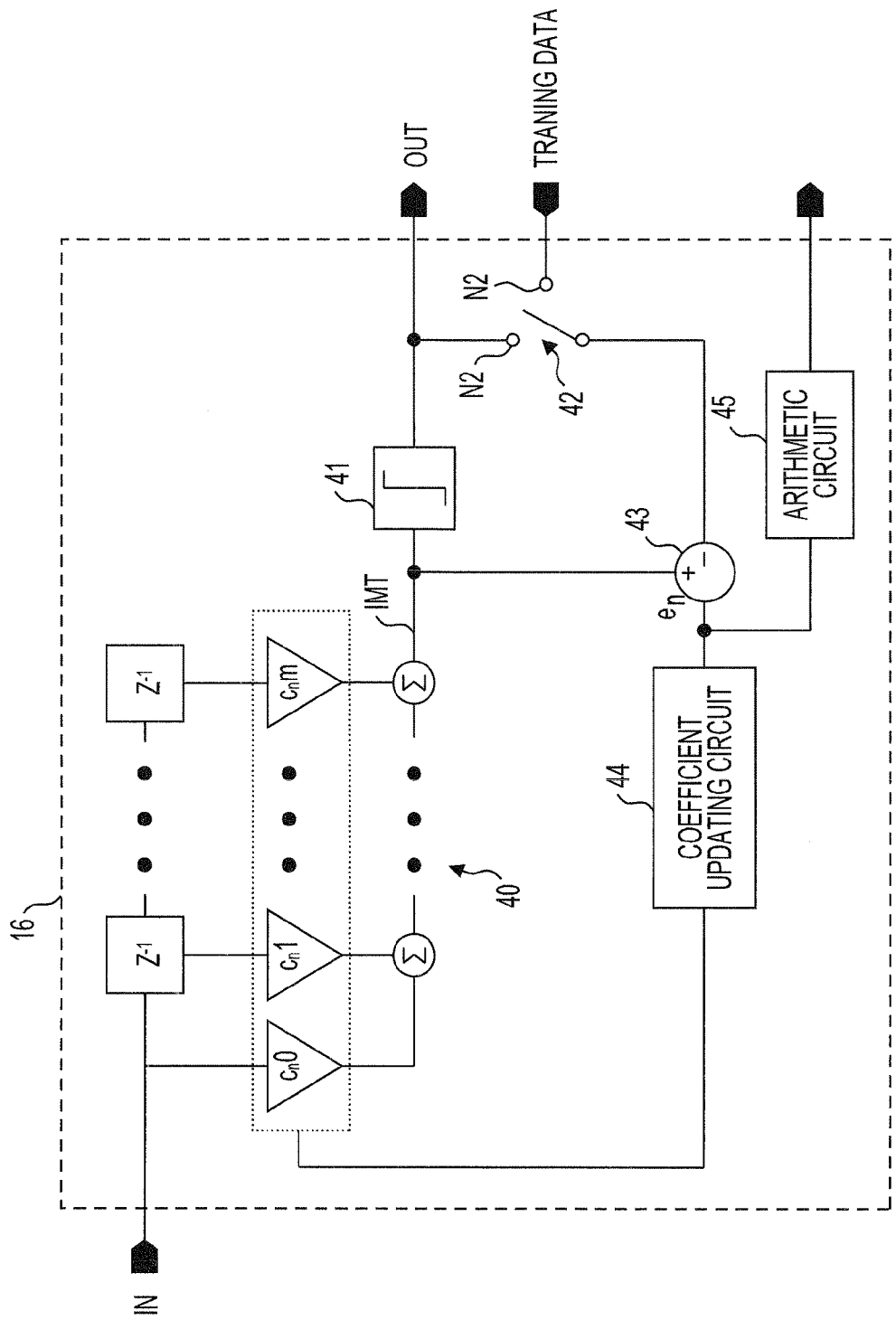
FIG. 5 illustrates an exemplary equalization processing circuit.

FIG. 5 illustrates still an exemplary equalization process circuit. The equalization process circuit 16 illustrated in FIG. 5 may be the equalization process circuit 16 illustrated in FIG. 1. The equalization process circuit 16 may include a feed forward equalizer (FFE). The equalization process circuit 16 includes a filter circuit 40, a determination circuit 41, a switch 42, an error detection circuit 43, a coefficient updating circuit 44, and an arithmetic circuit 45. The filter circuit 40 includes a plurality of delay elements $Z^{-1}$, a multiplication circuit that multiplies a signal by coefficients $c_n0$ to $c_nm$, which coefficients at time n, and an addition circuit $\Sigma$. The filter circuit 40 performs equalization process on a first signal IN and outputs the processed signal as a second signal IMT. The determination circuit 41 outputs a third signal OUT subsequent to level determination of "0" or "1", for example. When the switch 42 is coupled to a node N1 side, the third signal OUT is supplied to the error detection circuit 43. When the switch 42 is coupled to a node N2 side, training data is supplied to the error detection circuit 43. The error detection circuit 43 obtains an error, such as a difference, between the second signal IMT and either the third signal OUT or the training data. The error may be the difference between the two signals at the current timing. The filter coefficients $c_n0$ to $c_nm$ of the filter circuit 40 may be updated in accordance with the error output by the error detection circuit 43. The coefficients may be updated using a least mean squares (LMS) algorithm or a recursive least squares (RLS) algorithm, whereby the filter coefficients may be adjusted so as to minimize the mean square error of the error. The adjustment of the filter coefficients may be performed at the initialization time, for example, of the receiver circuit 12. The third signal OUT or training data may be used for the adjustment of the filter coefficients at the time of startup.

When the coefficients of the filter circuit 40 of the equalization processing circuit 1 is initialized, the filter coefficients may be adjusted based on the training data by coupling the switch 42 to the node N2 side. The first signal IN input to the equalization process circuit 16 may be a signal received by the receiver subsequent to the training data transmitted from a transmitter.

The arithmetic circuit 45 performs a given operation of the error output from the error detection circuit 43, and outputs the error signal ES from the equalization process circuit 16. The given operation process includes, for example, computing the square and calculating the absolute value of the error.

Figure 6:
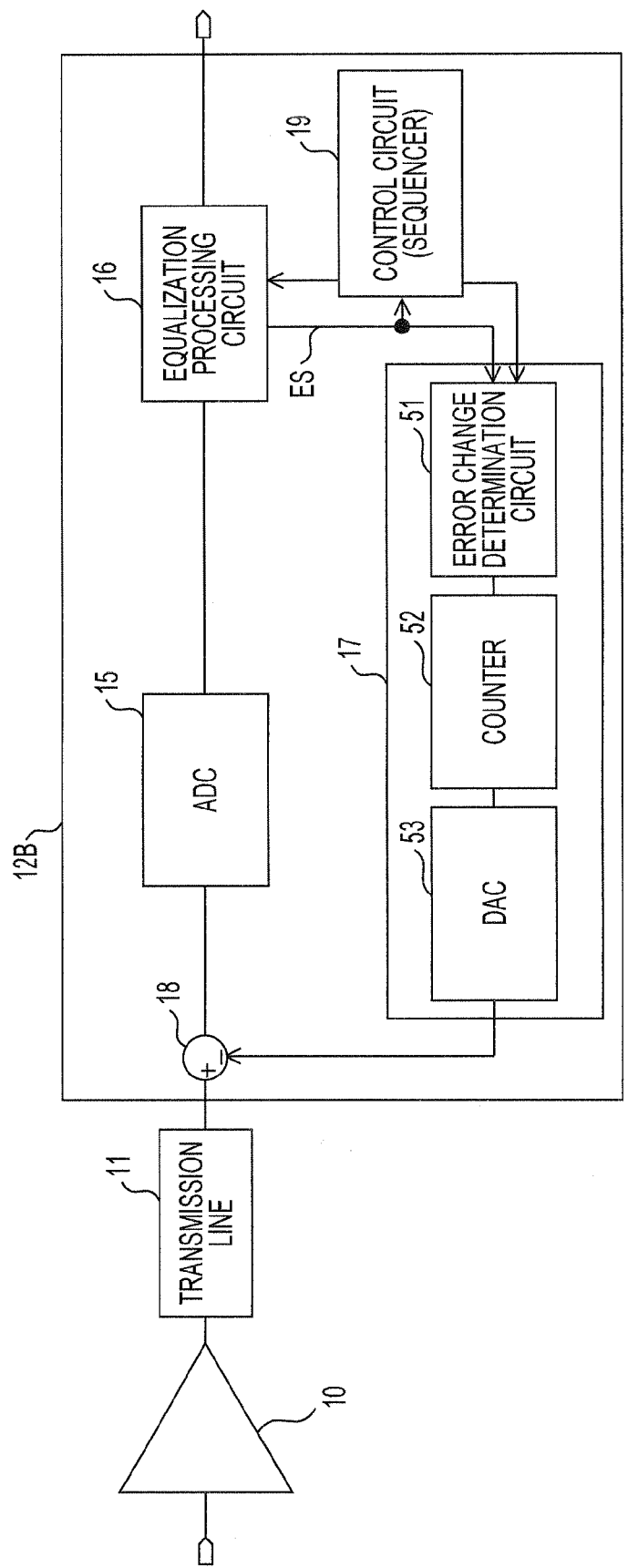
FIG. 6 illustrates an exemplary transmission/reception system.

FIG. 6 illustrates an exemplary transmission/reception system. In FIG. 6, elements that are substantially identical or similar to those in FIG. 1 are denoted by the same reference numerals and the descriptions thereof may be omitted or reduced. The transmission/reception system includes a transmission circuit 10 and a receiver circuit 12B. The receiver circuit 12B includes an ADC 15, an equalization processing circuit 16, an offset adjustment circuit 17, a signal addition/subtraction circuit 18, and a control circuit 19. The control circuit 19 may include a sequencer. The control circuit 19 controls the equalization process circuit 16 and the offset adjustment circuit 17, for example, at the time of startup of the receiver circuit 12B. The characteristics of equalization process and an offset are adjusted.

Figure 7:
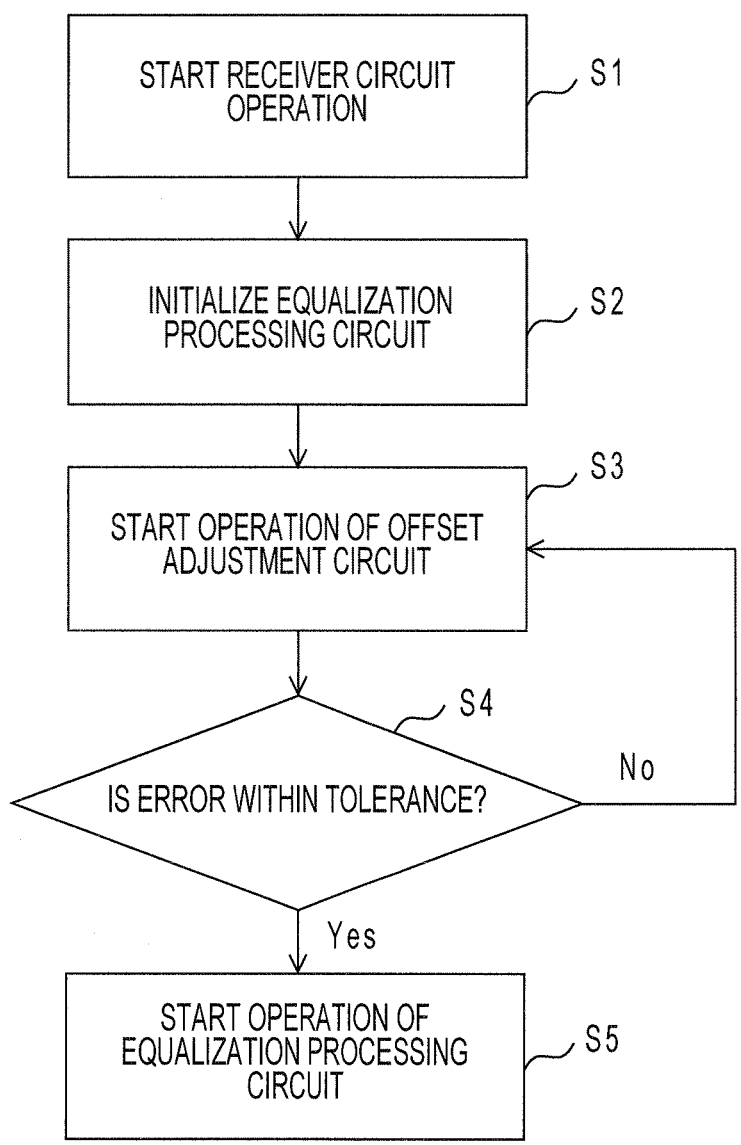
FIG. 7 illustrates an exemplary control sequence.

FIG. 7 illustrates an exemplary control sequence. The control sequence illustrated in FIG. 7 may be executed by the control circuit illustrated in FIG. 6. In operation S1, the receiver circuit 12 starts to operate at a time of power-on or recovery from resetting, for example. In operation S2, the control circuit 19 initializes the equalization process circuit 16, and sets the equalization circuit in an initialized state. The control circuit 19 adjusts the characteristics of the equalization process of the equalization process circuit 16 without offset adjustment performed by the offset adjustment circuit 17. The equalization process circuit 16 may adjust the characteristics of the equalization process based on the difference between a reception signal and a signal subsequent to signal determination as illustrated in FIGS. 3, 4, and 5, or based on the training data as illustrated in FIGS. 4 and 5.

In operation S3, the offset adjustment circuit 17 operates to adjust the offset in a state in which the equalization characteristics are ser. In operation S4, the control circuit 19 determines whether or not an error indicated by the error signal ES is equal to or under a tolerance value. When the error is not equal to or under a tolerance value, the process goes back to operation S3, and offset adjustment is repeated. Offset adjustment is repeated in a state in which the characteristics of the equalization are set until the error falls a tolerance value. When the error becomes equal to or under a tolerance value, the equalization process circuit 16 performs equalization process in operation S5, and the offset adjustment circuit 17 performs offset process. Thereby, a reception signal may be determined correctly. In operation S5, the control circuit 19 may determine whether or not adaptive equalization and adaptive offset adjustment are to be performed.

The offset is adjusted such that the error signal ES indicating the result of equalization becomes smaller, whereby the offset may be decreased.

The offset adjustment circuit 17 illustrated in FIG. 6 includes an error change determination circuit 51, a counter 52, and a digital-to-analog converter (DAC) 53. The offset adjustment circuit 17 adjusts stepwise the offset of the first signal such that an error indicated by the error signal ES becomes smaller. By comparing an error at time n−1 and an error at time n, for example, the error change determination circuit 51 determines whether the error has been decreased or increased. The counter 52 increments or decrements a count value based on the determination result of the error change determination circuit 51. The DAC 53 DA-converts the count values output from the counter 52, and outputs an analog signal corresponding to the count value. The analog signal, as a signal for compensating an offset, is added to or subtracted from a reception signal by the signal addition/subtraction circuit 18.

Figure 8:
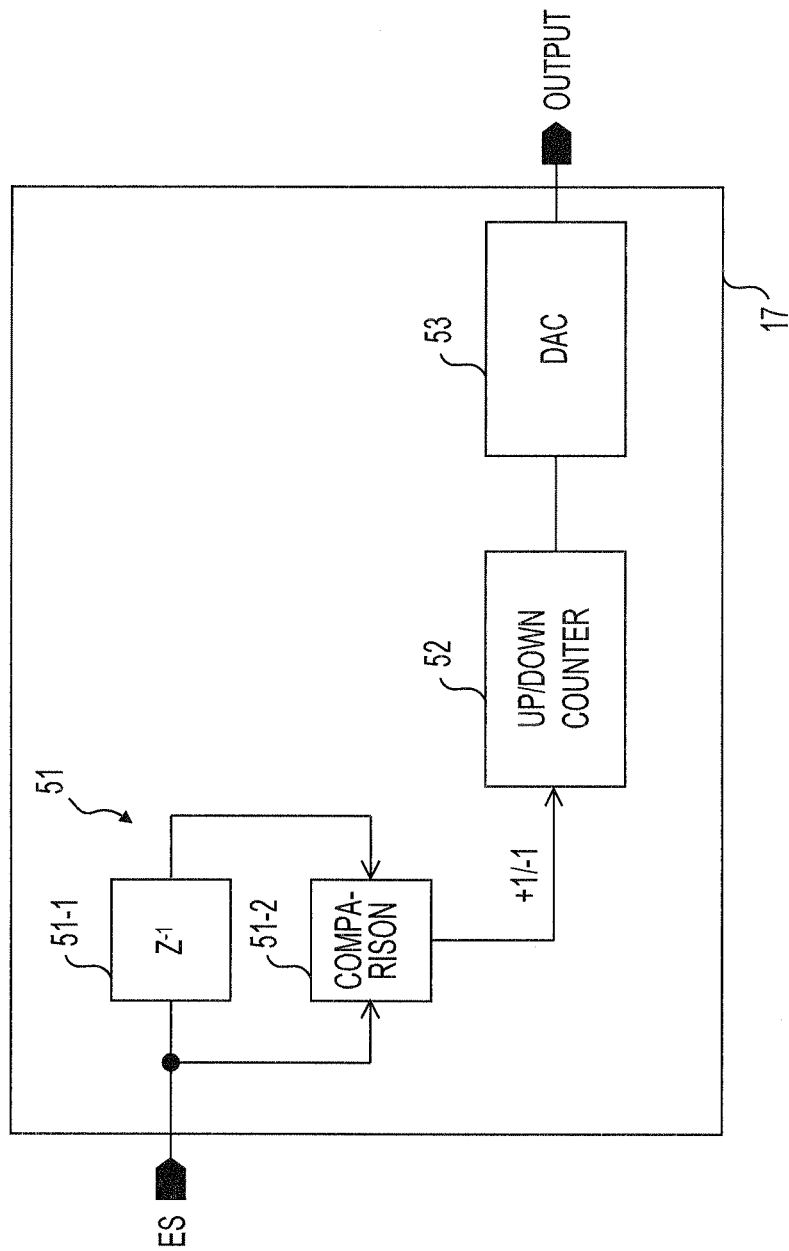
FIG. 8 illustrates an exemplary offset adjustment circuit.

FIG. 8 illustrates an exemplary offset adjustment circuit. In FIG. 8, elements that are substantially the same as or similar to those illustrated in FIG. 6 are denoted by the same reference numerals and the descriptions thereof may be omitted or reduced. The offset adjustment circuit 17 includes a delay element 51-1 that delays an input signal by one cycle, for example, one period of time, and a comparator circuit 51-2. The delay element 51-1 delays the error signal ES supplied from the equalization processing circuit 16 by one cycle, for example, one period of time. The comparator circuit 51-2 compares the error signal ES at a current time (for example, at a time n) output from the equalization processing circuit 16 with the error signal ES at a previous time (for example, at a time n−1) output from the delay element 51-1, and outputs a comparison result signal. In accordance with the comparison result signal, the counter 52 increments or decrements the count value. For example, when the error at the time n is smaller and the error is decreased, the count value is changed in the same direction as that at the time n−1. When the counter value was incremented at the time n−1, the counter value is incremented, and when the counter value was decremented at the time n−1, the counter value is decremented. When the error at the time n is larger and the error is increased, the count value is changed in a direction opposite to that at the time n−1. When the count value was incremented at the time n−1, the count value is decremented, and when the count value was decremented at the time n−1, the count value is incremented. The DAC 53 DA-converts the count value and outputs an analog signal corresponding to the count value.

Figure 9:
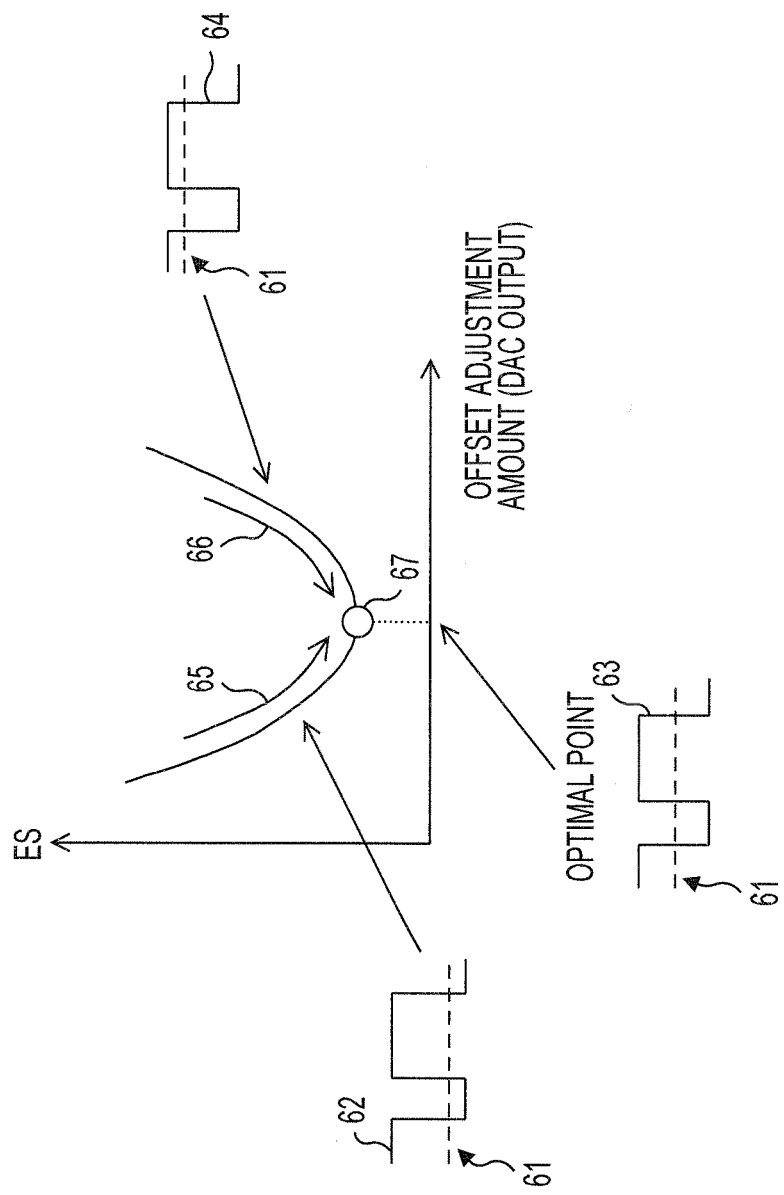
FIG. 9 illustrates an exemplary offset adjustment amount.

FIG. 9 illustrates an exemplary offset adjustment amount. The horizontal axis represents an offset adjustment amount, for example, the output of the DAC 53. The vertical axis represents the error signal ES. In a signal 62 corresponding to a threshold 61 for signal determination, the offset may be large and the signal ES may be large. In a signal 64 corresponding to the threshold 61, the offset may be large and the error signal ES may be large. In a signal 63 corresponding to the threshold 61, the offset is minimum and the error signal ES may be minimum as illustrated by the optimum point 67. The difference between the signals prior and subsequent to the determination may increase on the average. The offset is adjusted in accordance with the errors at the current time and the previous time, whereby the error signal ES becomes smaller and the offset adjustment amount approaches the optimal value, as indicated by the arrows 65 and 66 illustrated in FIG. 9.

Figure 10C:
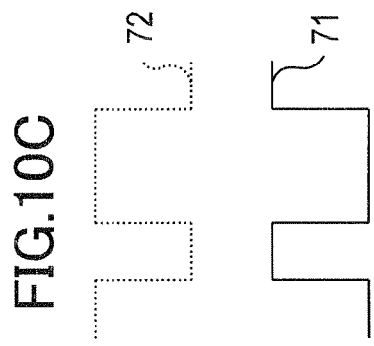
FIGS. 10A, 10B, and 10C illustrate exemplary offsets of a differential signal.
Figure 10B:
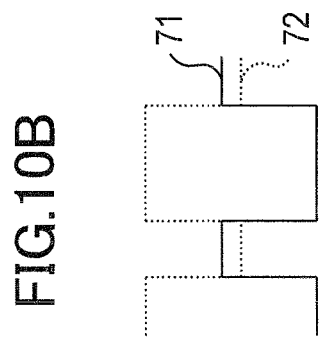
Figure 10A:
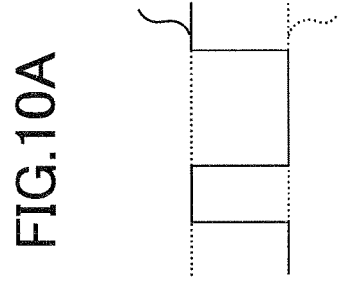

The offset illustrated in FIG. 9 is indicated as compared to a signal and a threshold value in an unbalanced transmission, such as a single-phase signal transmission. Offset may be adjusted also in a balanced transmission, such as a differential signal transmission. FIGS. 10A, 10B and 10C illustrate exemplary offsets of a differential signal. In FIG. 10A, there is not an offset between a positive-phase signal 71 and a negative-phase signal 72, and the waveform illustrated in FIG. 10A may be ideal. The error signal ES becomes minimum as indicated by the optimal point 67 illustrated in FIG. 9, for example. A signal is determined based on the difference between the positive-phase signal 71 and the negative-phase signal 72. Referring to FIG. 10B, there is an offset between the positive-phase signal 71 and the negative-phase signal 72, and the error signal ES may increase at a position further from the optimal point 67 illustrated in FIG. 9, for example. A signal is determined based on the difference between the positive-phase signal 71 and the negative-phase signal 72. Referring to FIG. 10O, there is an offset between the positive-phase signal 71 and the negative-phase signal 72, and the error signal ES may increase at a position further from the optimal point 67 illustrated in FIG. 9, for example. In differential signals, as illustrated in FIGS. 10B and 10C, where a signal is not determined, the offset may be adjusted in accordance with the current and previous errors based on the difference between the positive-phase signal 71 and the negative-phase signal 72, whereby the error signal ES may be decreased and the offset adjustment amount may approach an optimal value as indicated by the arrow 65 or 66 illustrated in FIG. 9.

Figure 11:
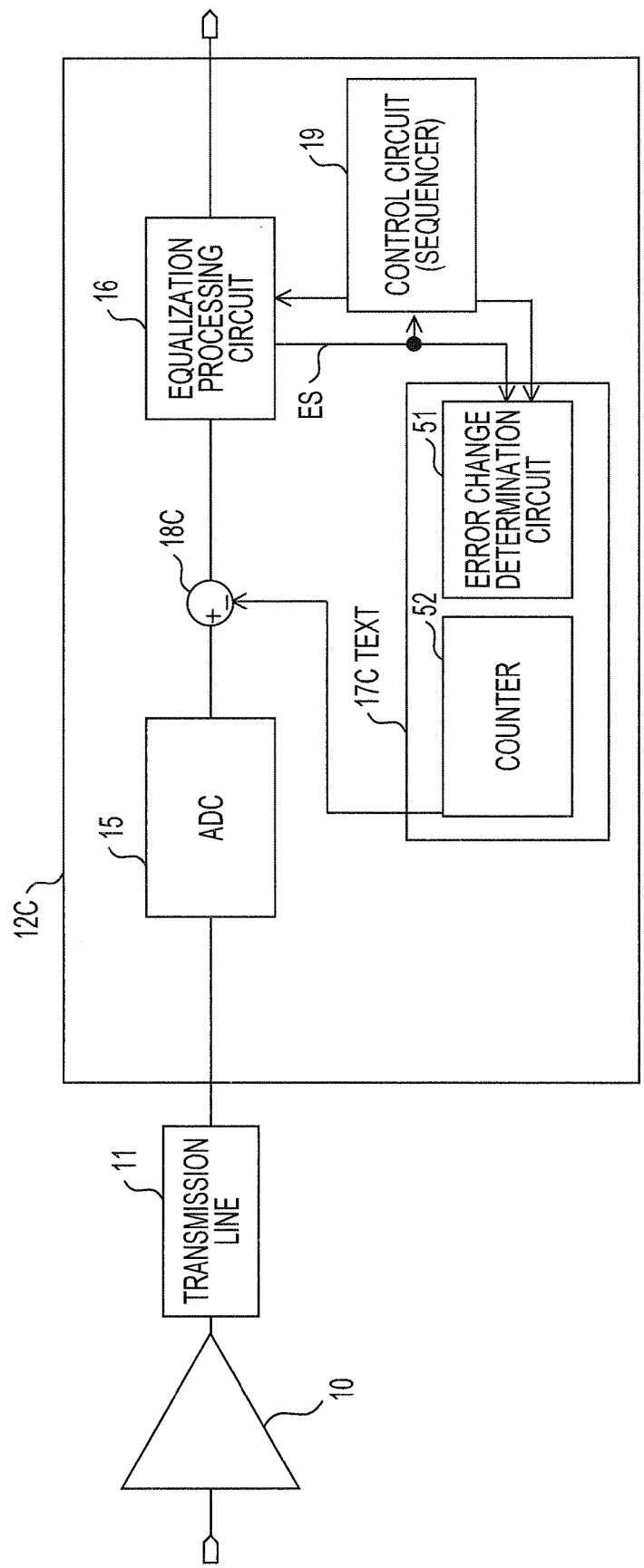
FIG. 11 illustrates an exemplary transmission/reception system.

FIG. 11 illustrates an exemplary transmission/reception system. Referring to FIG. 11, elements that are substantially the same or similar to those in FIG. 6 are denoted by the same reference numerals, and the descriptions thereof may be omitted or reduced. The transmission/reception system includes a transmission circuit 10 and a receiver circuit 12C. The receiver circuit 12C includes an ADC 15, an equalization processing circuit 16, an offset adjustment circuit 17C, a signal addition/subtraction circuit 18C, and a control circuit 19. The signal addition/subtraction circuit 18C is arranged on the output side of the ADC 15. The offset adjustment amount of a digital signal generated by the offset adjustment circuit 17C is added to or subtracted from the output of the ADC 15. The offset adjustment amount of a digital signal may include the count value of the counter 52 illustrated in FIG. 16. As illustrated in FIG. 6, an offset may be adjusted and appropriate equalization may be performed.

Figure 12:
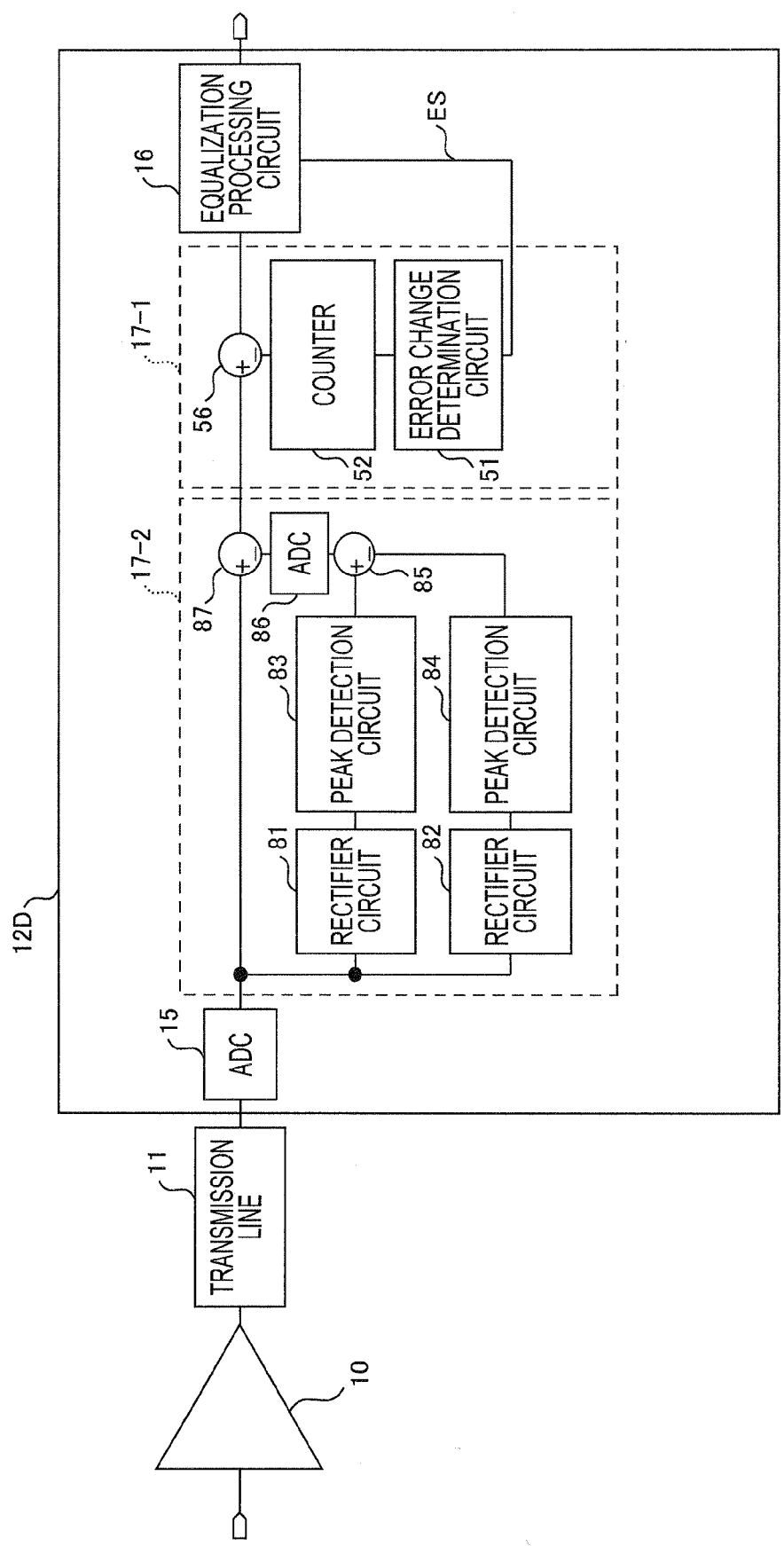
FIG. 12 illustrates an exemplary transmission/reception system.

FIG. 12 illustrates an exemplary transmission/reception system. Referring to FIG. 12, elements that are substantially the same as or similar to those in FIGS. 1 and 6 are denoted by the same reference numerals, and the descriptions thereof may be omitted or reduced. The transmission/reception system includes a transmission circuit 10 and a receiver circuit 12D. The receiver circuit 12D includes an ADC 15, an equalization processing circuit 16, a first offset adjustment circuit 17-1, and a second offset adjustment circuit 17-2. The first offset adjustment circuit 17-1 includes an error change determination circuit 51, a counter 52, and a signal addition/subtraction circuit 56. The offset adjustment amount of a digital signal generated by the counter 52 is added to or subtracted from the output of the ADC 15 by the first offset adjustment circuit 17-1 via the signal addition/subtraction circuit 56.

The second offset adjustment circuit 17-2 includes rectifier circuits 81 and 82, peak detection circuits 83 and 84, a signal addition/subtraction circuit 85, a halving operation circuit 86, and a signal addition/subtraction circuit 87. The second offset adjustment circuit 17-2 detects the upper and lower peak values of a reception signal and adjusts the offset of the reception signal based on the upper and lower peak values. The first offset adjustment circuit 17-1 adjusts finely the offset after the second offset adjustment circuit 17-2 adjusted coarsely the offset. High-speed and high-accuracy offset adjustment may be performed.

Figure 13A:
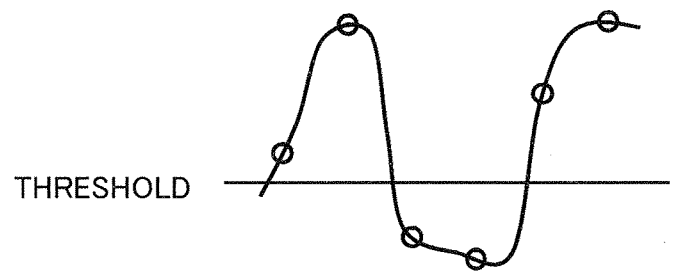
FIGS. 13A, 13B, and 13C illustrate an exemplary operation of a rectifier circuit.
Figure 13B:
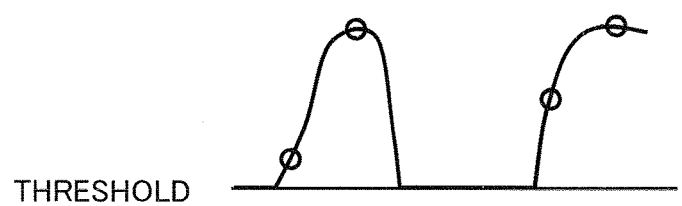
Figure 13C:

FIGS. 13A, 13B and 13C illustrate exemplary operations of a rectifier circuit. FIG. 13A illustrates an exemplary digital signal waveform output from the ADC 15 illustrated in FIG. 12. The white circles indicate the digital signal output values of the ADC 15 provided at discrete times. The solid line interpolated between the white circles illustrates an appropriate predictive waveform. The rectifier circuit 81 outputs a signal illustrated in FIG. 13B in response to the output of the ADC 15 illustrated in FIG. 13A. The rectifier circuit 81 rectifies the digital signal waveform output from the ADC 15 and outputs a digital signal waveform above a given threshold. The rectifier circuit 82 outputs a signal illustrated in FIG. 13C in response to the output of the ADC 15 illustrated in FIG. 13A. The rectifier circuit 82 rectifies the digital signal waveform output from the ADC 15 and outputs a polarity-reversed digital signal waveform below a given threshold.

Figure 14:
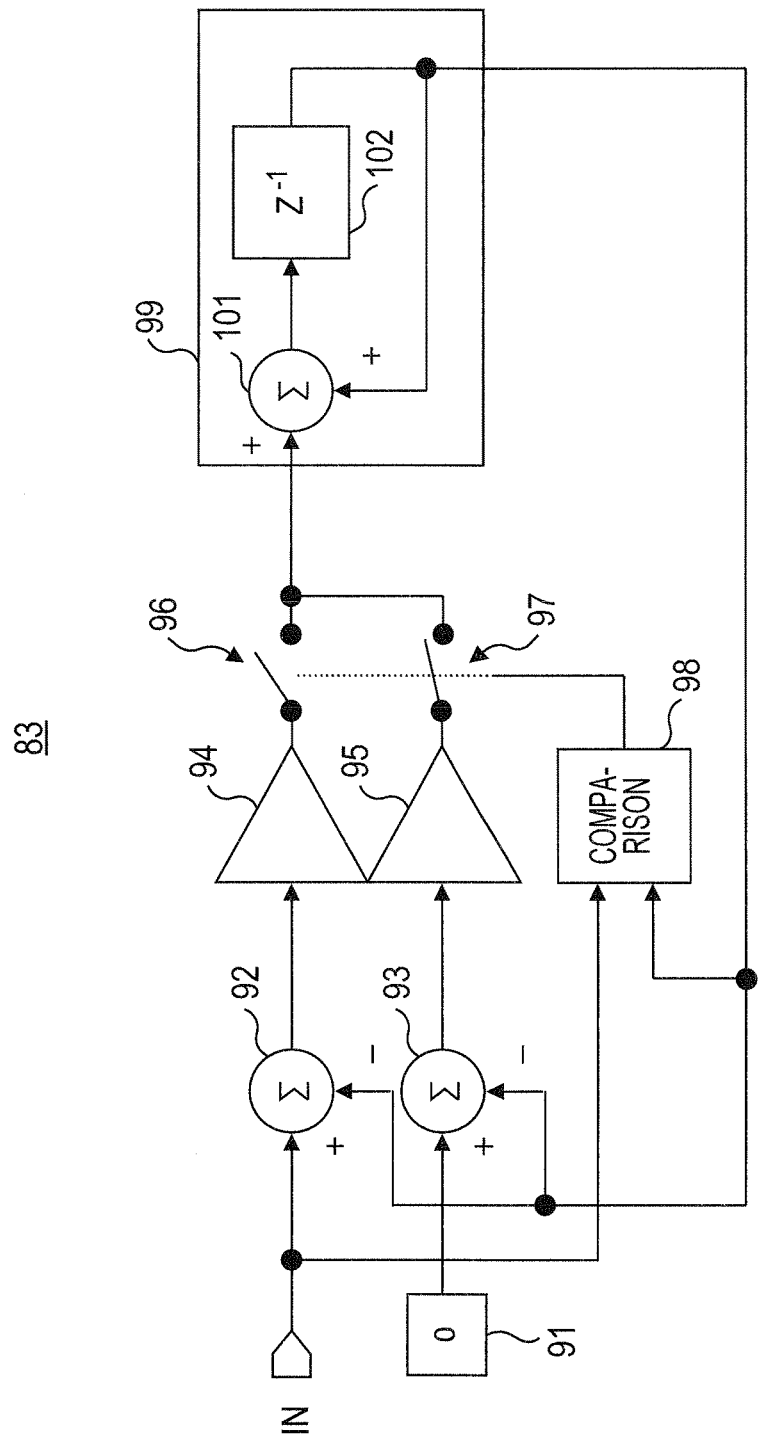
FIG. 14 illustrates an exemplary peak detection circuit.

FIG. 14 illustrates an exemplary peak detection circuit. The peak detection circuit illustrated in FIG. 14 may be the peak detection circuits 83 and 84 illustrated in FIG. 12. The peak detection circuit 83 includes a reference level register 91, addition/subtraction circuits 92 and 93, amplifier circuits 94 and 95, switching circuits 96 and 97, a comparator circuit 98, and an integration circuit 99. The integration circuit 99 includes an addition/subtraction circuit 101 and a delay element 102 causing a one-cycle delay (one-period delay). The delay element 102 holds the current peak detection result. The addition/subtraction circuit 92 subtracts the detected peak value from the input signal value In, and the amplifier circuit 94 multiples the subtraction result by a gain G1. The addition/subtraction circuit 93 subtracts the detected peak value from the reference value held by the reference level register 91, for example, zero, and the amplifier circuit 95 multiplies the subtraction result by a gain G2. The comparator circuit 98 compares the input signal value In with the detected peak value. When the input signal value In is larger, the switching circuit 96 is switched on and the switching circuit 97 is switched off, whereby the positive signal output from the amplifier circuit 94 is supplied to the integration circuit 99. When the input signal value In is smaller, the switching circuit 96 is switched off and the switching circuit 97 is switched on, whereby the negative signal output from the amplifier circuit 95 is supplied to the integration circuit 99. The addition/subtraction circuit 101 of the integration circuit 99 adds the current detected peak value to the supplied positive or negative signal, and updates the detected peak value. The detected peak value held by the integration circuit 99 follows the increase of the input signal value In at a rate of change of the gain G1 multiplied by the difference between the input signal value In and the detected peak value. The detected peak value held by the integration circuit 99 follows the decrease of the input signal value In at a speed obtained by multiplying the difference between the input signal value In and the detected peak value by the gain G2. The reference value and the gains G1 and G2 are set to appropriate values, whereby the peak value of an input signal waveform is detected without being influenced by noise.

Figure 15:
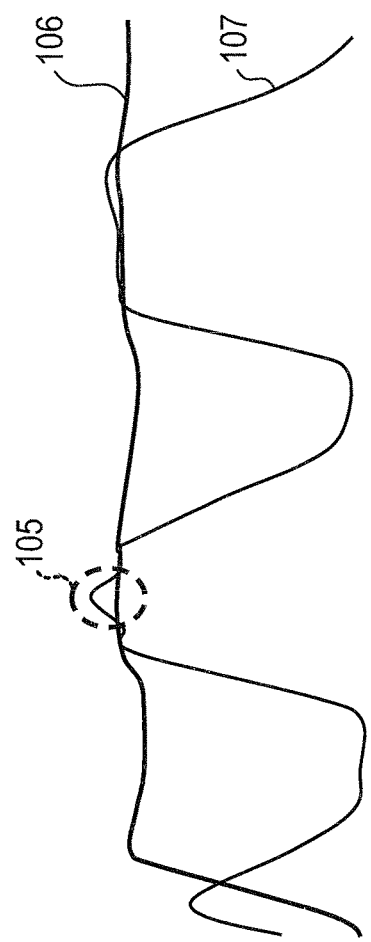
FIG. 15 illustrates an exemplary peak value.

FIG. 15 illustrates exemplary peak values. The peak values illustrated in FIG. 15 may be detected by the peak detection circuit illustrated in FIG. 14. An input waveform 107 alternates between a high level and a low level. The input waveform 106 has a portion, as illustrated by a signal portion 105, which becomes higher than a peak value due to noise. A detected peak value 106, which is the output of the integration circuit 99, has the peak value of the input waveform 106, such as the high level, without being influenced by the noise in the signal portion 105.

The signal addition/subtraction circuit 85 illustrated in FIG. 12 subtracts the output value of the peak detection circuit 84 from the output value of the peak detection circuit 83 to obtain the difference between the upper and lower peak values of the output of the ADC 15. The difference between the peak value of the rectified waveform illustrated in FIG. 13B and the peak value of the rectified waveform illustrated in FIG. 13C is obtained. The halving operation circuit 86 halves the difference. The operation result of the halving operation circuit 86 may indicate the difference between the center of the signal in the up-down direction illustrated in FIG. 13A and the threshold, for example. For example, when the threshold is located at the center of the waveform, the operation result of the halving operation circuit 86 may be zero. The signal addition/subtraction circuit 87 subtracts the operation result of the halving operation circuit 86 from the output of the ADC 15, thereby adjusting an offset.

Figure 16:
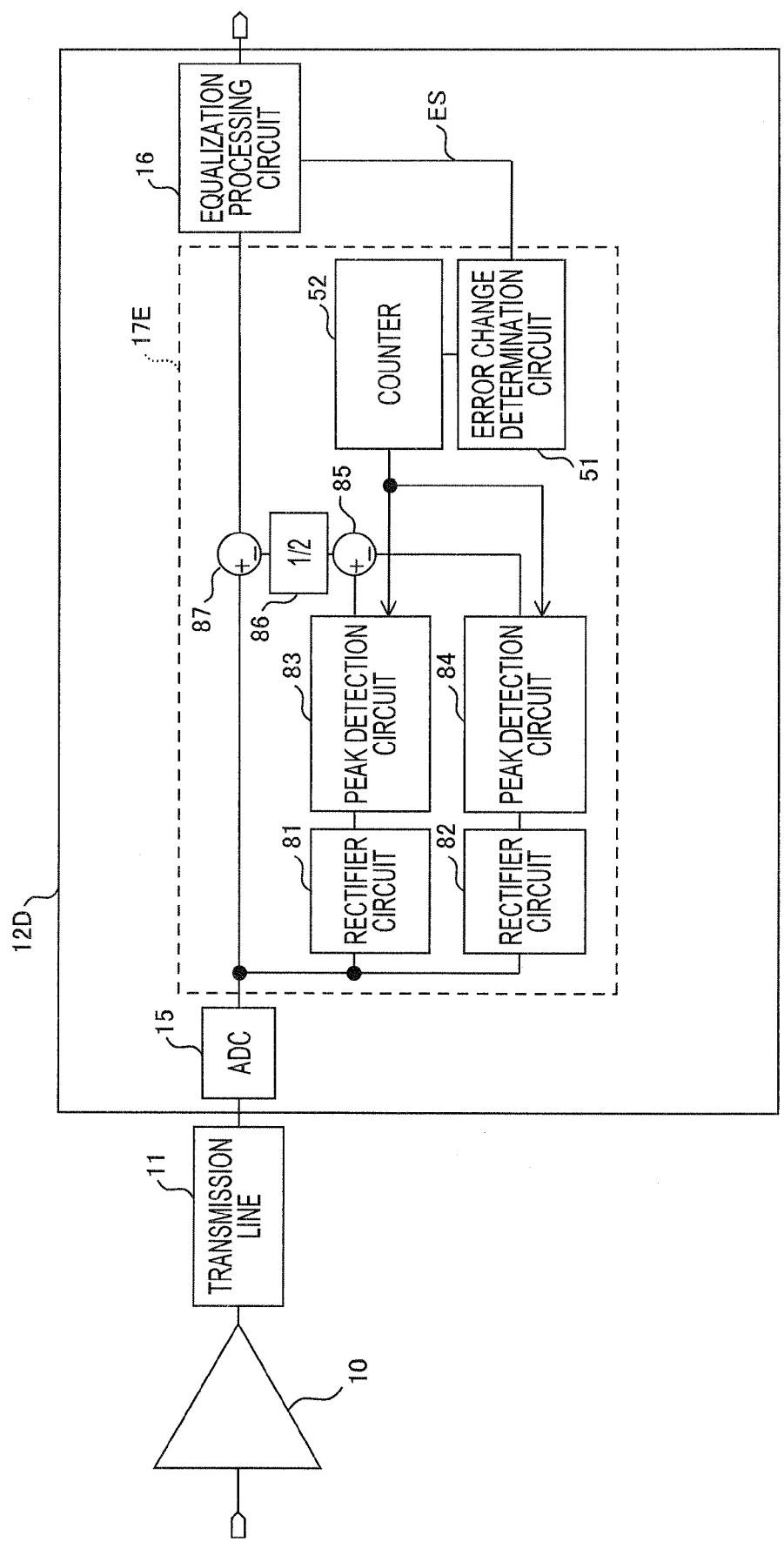
FIG. 16 illustrates an exemplary transmission/reception system.

FIG. 16 illustrates an exemplary transmission/reception system. Referring to FIG. 16, elements that are substantially the same as or similar to those in FIG. 12 are denoted by the same reference numerals, and the descriptions thereof may be omitted or reduced. The transmission/reception system includes a transmission circuit 10 and a receiver circuit 12E. The receiver circuit 12E includes an ADC 15, an equalization processing circuit 16, an offset adjustment circuit 17E. The offset adjustment circuit 17E includes an error change determination circuit 51, a counter 52, rectifier circuits 81 and 82, peak detection circuits 83E and 84E, a signal addition/subtraction circuit 85, a halving operation circuit 86, and a signal addition/subtraction circuit 87.

In the offset adjustment circuit 17E, the upper and lower peak values of an input signal waveform is detected and the offset of the input signal waveform is adjusted in accordance with the upper and lower peak values. The parameters for detecting the upper and lower peak values are controlled in accordance with an error signal ES. The reference values of the peak detection circuits 83E and 84E, and gains G1 and G2 are adjusted in accordance with a count value corresponding to the error signal ES output from the counter 52.

Figure 17:
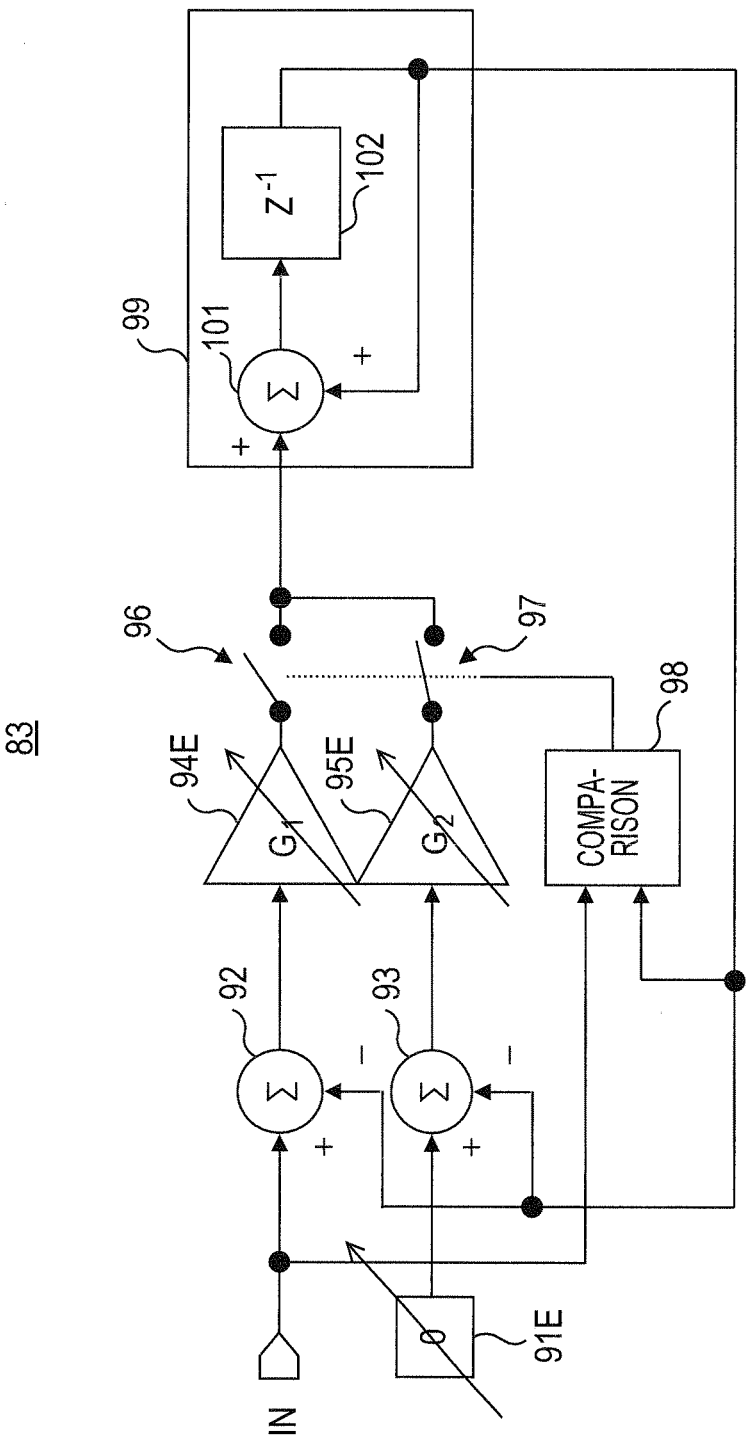
FIG. 17 illustrates an exemplary peak detection circuit.

FIG. 17 illustrates an exemplary peak detection circuit. The peak detection circuit illustrated in FIG. 17 may be the peak detection circuits 83E and 84E illustrated in FIG. 16. Referring to FIG. 17, elements that are substantially the same as or similar to those in FIG. 14 are denoted by the same reference numerals, and the descriptions thereof may be omitted or reduced. The peak detection circuit 83E illustrated in FIG. 17 includes a reference level register 91E, amplifier circuits 94E and 95E. The reference level register 91E and the amplifier circuits 94 and 95 illustrated in FIG. 17 may respectively correspond to the reference level register 91 and the amplifier circuits 94 and 95 illustrated in FIG. 14. The reference level stored in the reference level register 91E may be adjusted in accordance with the value of the counter 52. The gains of the amplifier circuits 94E and 95E may be adjusted in accordance with the value of the counter 52. Under the control of the parameters, i.e., the reference values of the peak detection circuits 83 and 84 and the gains G1 and G2, the signal addition/subtraction circuit 87 adjusts the offset adjustment amount to be added or subtracted such that the error signal ES becomes smaller. High-speed and high-accuracy offset adjustment is performed.

Example embodiments of the present invention have now been described in accordance with the above advantages. It will be appreciated that these examples are merely illustrative of the invention. Many variations and modifications will be apparent to those skilled in the art.

The invention claimed is:

1. A receiver circuit, comprising:
an equalization circuit that equalizes a first signal from an analog digital converter to obtain a second signal, and adjusts a characteristic of an equalization in accordance with an error between the second signal and a third signal;
a first determination circuit that determines a level of the second signal and outputs a determination as the third signal; and
a first offset adjustment circuit that adjusts an offset of a fourth signal which is input to the analog digital converter in accordance with an error signal indicating the error.

2. The receiver circuit according to claim 1, wherein the equalization circuit includes:
a filter circuit that equalizes the first signal and outputs the second signal;
an error detection circuit that obtains the error between the second signal and the third signal, and
a coefficient updating circuit that adjusts a filter coefficient of the filter circuit in accordance with the error.

3. The receiver circuit according to claim 2, wherein the error detection circuit switches between a first operation to obtain the error between the second signal and the third signal and a second operation to obtain an error between the second signal and a fourth signal.

4. The receiver circuit according to claim 1, wherein the first offset adjustment circuit adjusts the offset of the first signal such that the error becomes smaller.

5. The receiver circuit according to claim 1, further comprising, a control circuit that adjusts the characteristic of the equalization without adjusting the offset, and adjusts the offset after adjusting the characteristic of the equalization.

6. The receiver circuit according to claim 1, further comprising:
a second determination circuit that monitors a change of the error; and
a counter that counts based on an output of the second determination circuit.

7. The receiver circuit according to claim 6, further comprising:
a digital-analog converter that converts an output of the counter into an analog signal,
wherein the first offset adjustment circuit adjusts the offset based on the analog signal.

8. A method of adjusting an offset, comprising:
equalizing a first signal using an equalization circuit to output a second signal;
determining a level of the second signal and outputs a determination signal as a third signal;
obtaining a first error signal corresponding to an error between the second signal and the third signal;
adjusting a characteristic of an equalization in accordance with the first error signal;
equalizing a fourth signal using the equalization circuit having an adjusted characteristic of the equalization to output a fifth signal;
determining a level of the fifth signal and outputting a determination signal as a sixth signal;
outputting a second error signal corresponding to a difference between the fifth signal and the sixth signal; and
adjusting an offset of the fifth signal in accordance with the second error signal.

9. The method of adjusting an offset according to claim further comprising:
detecting an upper peak value and a lower peak value of the fifth signal;
adjusting an offset of the first signal in accordance with the upper peak value and the lower peak value; and
controlling a parameter for detecting the upper peak value and the lower peak value in accordance with at least one of the first error signal and the second error signal.

10. A receiver system, comprising:
a receiver circuit that is coupled to a transmission line transmitting a signal from a transmission circuit and that receives the signal from the transmission circuit, wherein the receiver circuit includes:
an equalization circuit that equalizes a first signal from an analog digital converter to obtain a second signal, and adjusts a characteristic of an equalization in accordance with an error between the second signal and a third signal;
a first determination circuit that determines a level of the second signal and outputs a determination signal as the third signal; and
a first offset adjustment circuit that adjusts an offset of a fourth signal which is input to the analog digital converter in accordance with an error signal indicating the error.

11. The receiver system according to claim 10, wherein the equalization circuit includes:
- a filter circuit that equalizes the first signal and outputs the second signal;
- an error detection circuit that obtains the error between the second signal and the third signal; and
- a coefficient updating circuit that adjusts a filter coefficient of the filter circuit in accordance with the error.

12. The receiver system according to claim 10, wherein the error detection circuit switches between a first operation to obtain the error between the second signal and the third signal and a second operation to obtain an error between the second signal and a fourth signal.

13. The receiver system according to claim 10, wherein the first offset adjustment circuit adjusts the offset of the first signal such that the error becomes smaller.

14. The receiver system according to claim 10, further comprising a control circuit that adjusts the characteristic of the equalization without adjusting the offset, and adjusts the offset after adjusting the characteristic of the equalization.

15. The receiver system according to claim 10, further comprising:
- a second determination circuit that monitors a change of the error; and
- a counter that counts based on an output of the second determination circuit.

16. The receiver system according to claim 15, further comprising:
- a digital-analog converter that converts an output of the counter into an analog signal,
- wherein the first offset adjustment circuit adjusts the offset based on the analog signal.

* * * * *

UNITED STATES PATENT AND TRADEMARK OFFICE
CERTIFICATE OF CORRECTION

| | | |
|---|---|---|
| PATENT NO. | : 8,634,454 B2 | Page 1 of 1 |
| APPLICATION NO. | : 12/826420 | |
| DATED | : January 21, 2014 | |
| INVENTOR(S) | : Masaya Kibune | |

It is certified that error appears in the above-identified patent and that said Letters Patent is hereby corrected as shown below:

Title Page

Item (73) - please correct the Assignee to read as follows:

--Fujitsu Limited, Kawasaki (JP)--

Signed and Sealed this
Eighth Day of July, 2014

Michelle K. Lee
*Deputy Director of the United States Patent and Trademark Office*